(12) United States Patent
Feiring et al.

(10) Patent No.: US 7,019,092 B2
(45) Date of Patent: Mar. 28, 2006

(54) FLUORINATED COPOLYMERS FOR MICROLITHOGRAPHY

(75) Inventors: Andrew Edward Feiring, Wilmington, DE (US); Frank L. Schadt, III, Wilmington, DE (US); Gary Newton Taylor, Northborough, MA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/502,839

(22) PCT Filed: Feb. 26, 2003

(86) PCT No.: PCT/US03/05705

§ 371 (c)(1), (2), (4) Date: Jul. 28, 2004

(87) PCT Pub. No.: WO03/075094

PCT Pub. Date: Sep. 12, 2003

(65) Prior Publication Data

US 2005/0020793 A1     Jan. 27, 2005

Related U.S. Application Data

(60) Provisional application No. 60/389,790, filed on Jun. 19, 2002, provisional application No. 60/361,124, filed on Mar. 1, 2002.

(51) Int. Cl.
*C08F 16/12* (2006.01)

(52) U.S. Cl. ............... 526/247; 526/242; 526/243; 526/282; 430/270.1

(58) Field of Classification Search ............. 526/247, 526/242, 243, 282; 430/270.1
See application file for complete search history.

(56) References Cited

U.S. PATENT DOCUMENTS

| 3,179,640 | A | * | 4/1965 | Middleton | 526/249 |
|---|---|---|---|---|---|
| 3,444,148 | A | * | 5/1969 | Adelman | 526/242 |
| 4,544,235 | A | * | 10/1985 | Nishida et al. | 385/145 |
| 6,080,524 | A | * | 6/2000 | Choi | 430/270.1 |
| 6,303,266 | B1 | * | 10/2001 | Okino et al. | 430/270.1 |
| 6,521,730 | B1 | * | 2/2003 | Pabon et al. | 526/245 |
| 6,800,416 | B1 | * | 10/2004 | Kudo et al. | 430/270.1 |
| 2004/0137360 | A1 | * | 7/2004 | Berger et al. | 430/270.1 |

FOREIGN PATENT DOCUMENTS

| WO | WO 00 17712 A | 3/2000 |
|---|---|---|
| WO | WO 00 67072 A | 9/2000 |
| WO | WO 00 66575 A | 11/2000 |
| WO | WO 01 37047 A | 5/2001 |
| WO | WO-01-37047 A2 * | 5/2001 |
| WO | WO 02 31595 A | 4/2002 |
| WO | WO-02-31595 A2 * | 4/2002 |
| WO | WO 02 33489 A | 4/2002 |
| WO | WO-02-33489 A2 * | 4/2002 |
| WO | WO 02 44811 A | 6/2002 |
| WO | WO 02-44811 A2 * | 6/2002 |

OTHER PUBLICATIONS

K. Patterson, et al., Advances in Resist Technology and Processing XVII, Proc. of SPIE, Mar., 2000, pp. 365-374, vol. 3999.
Patent Abstract, AN 1987-268006, JP 62186907, Agency of Ind. Sci. & Technology, Sep. 22, 1993.

* cited by examiner

*Primary Examiner*—David W. Wu
*Assistant Examiner*—Henry S. Hu

(57) ABSTRACT

Fluorinated copolymers useful in photoresist compositions and associated processes for microlithography are described. These copolymers are comprised of a fluoroalcohol or protected fluoroalcohol functional group which simultaneously imparts high ultraviolet (UV) transparency and developability in basic media to these materials and a repeat unit derived from an acrylate monomer containing a fluoroalkyl group or a hydroxyl substituted alkyl group. The materials of this invention have high UV transparency, particularly at 193 and 157 nm, which makes them highly useful for lithography at these short wavelengths.

16 Claims, No Drawings

FLUORINATED COPOLYMERS FOR MICROLITHOGRAPHY

REFERENCE TO RELATED APPLICATIONS

This is a non-provisional patent application claiming the benefit of the filing date of U.S. Provisional Application Ser. No. 60/389,790 filed on Jun. 19, 2002 and Ser. No. 60/361,124 filed on Mar. 1, 2002 which are incorporated herein by reference in their entirety.

BACKGROUND OF THE INVENTION

1. Field of the Invention

The present invention pertains to copolymers useful for photoimaging compositions. These copolymers are comprised of a fluoroalcohol or protected fluoroalcohol functional group and a repeat unit derived from an acrylate monomer containing a fluoroalkyl group or a hydroxyl substituted alkyl group. Such groups have been found to promote adhesion of the copolymers, and photoresists derived from such copolymers, to substrates used in the manufacture of semiconductor devices. The copolymers are especially useful in photoresist compositions having high UV transparency (particularly at short wavelengths, e.g., 193 nm and 157 nm).

2. Description of Related Art

Polymer products are used as components of imaging and photosensitive systems and particularly in photoimaging systems. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

For imaging features at the submicron level in semiconductor devices, electromagnetic radiation in the far or extreme ultraviolet (UV) is needed. Photolithography using 193 nm exposure is a leading candidate for future microelectronics fabrication using 0.18 and 0.13 µm design rules; photolithography using 157 nm exposure may be needed for 0.100 µm or less design rules. The opacity of traditional near-UV and far-UV organic photoresists at 193 nm or shorter wavelengths precludes their use in single-layer schemes at 157 nm.

Photoresists comprising copolymers with fluoroalcohol functional groups have been disclosed in WO 00/67072.

Copolymers of fluorinated alcohol monomers with other comonomers have been reported (U.S. Pat. No. 3,444,148 and JP 62186907 A2). These patents are directed to membrane or other non-photosensitive films or fibers, and do not teach the use of fluorinated alcohol comonomers in photosensitive layers (e.g., resists).

There is a critical need for other novel resist compositions that have high transparency at 193 nm, and more preferably at or below 157 nm, and also have other key properties such as good plasma etch resistance and adhesive properties.

SUMMARY OF THE INVENTION

This invention relates to a fluorine-containing copolymer comprising:

a. a first repeat unit derived from an ethylenically unsaturated compound containing a functional group having the structure:

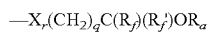

wherein $R_f$ and $R_f'$ are the same or different fluoroalkyl groups of from 1 to 10 carbon atoms, or taken together are $(CF_2)_n$;

n is an integer from 2 to 10;

X is selected from the group consisting of S, O, N, and P;

q=0 and r=0, or q=1 and r=0 or 1; and $R_a$ is H or an acid- or base-labile protecting group; and b. a second repeat unit derived from $CH_2\!=\!CRCO_2CH_2R''$, wherein R" is a fluoroalkyl group of 1 to 4 carbon atoms or a hydroxyalkyl group of 1 to 4 carbon atoms; and R is H, F, an alkyl group of 1 to 5 carbon atoms, or a fluoroalkyl group of 1 to 5 carbon atoms.

The copolymers of this invention are useful as the base resin in photoresist compositions comprising the copolymers of this invention, a photoactive component, and optionally other additives. Processes for preparing a photoresist image on a substrate using such photoresists are also disclosed herein.

DETAILED DESCRIPTION OF THE PREFERRED EMBODIMENTS

Fluorinated Alcohol Copolymers

A fluorine-containing copolymer of this invention comprises a repeat unit derived from at least one ethylenically unsaturated compound containing functional group derived from a fluoroalcohol or protected fluoroalcohol functional group. This functional group contains fluoroalkyl groups, designated $R_f$ and $R_f'$, which can be partially or fully fluorinated alkyl groups. $R_f$ and $R_f'$ are the same or different fluoroalkyl groups of from 1 to 10 carbon atoms or taken together are $(CF_2)_n$ wherein n is 2 to 10. The terms "taken together" indicate that $R_f$ and $R_f'$ are not separate, discrete fluorinated alkyl groups, but that together they form a ring structure such as is illustrated below in case of a 5-membered ring:

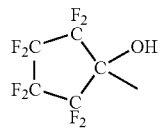

$R_f$ and $R_f'$ must be sufficiently fluorinated to impart acidity to the hydroxyl (—OH) of the corresponding fluoroalcohol functional group, such that the hydroxyl proton can be substantially removed in basic media (e.g., aqueous sodium hydroxide or tetraalkylammonium hydroxide solution). Preferably, there is sufficient fluorine in the fluoroalcohol functional group such that the hydroxyl group has a pKa value of 5<pKa<11. Preferably, $R_f$ and $R_f'$ are independently perfluoroalkyl groups of 1 to 5 carbon atoms, most preferably, trifluoromethyl ($CF_3$). The number of fluoroalcohol groups is determined for a given composition by optimizing the amount needed for good development in aqueous alkaline developer.

More specfically, the fluorine-containing copolymers comprise a repeat unit derived from at least one ethylenically unsaturated compound containing a fluoroalcohol functional group or a protected fluoroalcohol functional group having the structure:

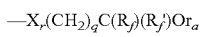

wherein $R_f$ and $R_f'$ are the same or different fluoroalkyl groups of from 1 to 10 carbon atoms, or taken together are $(CF_2)_n$; n is an integer from 2 to 10; X is selected from the group consisting of S, O, N, and P; q=0 and r=0, or q=1 and r=0 or 1; and $R_a$ is H or an acid- or base-labile protecting group which can be cleaved by photo-generated acid or base (vide infra). Preferably, X is O.

Some illustrative, but nonlimiting, examples of representative comonomers containing a fluoroalcohol functional group that are within the scope of the invention are presented below:

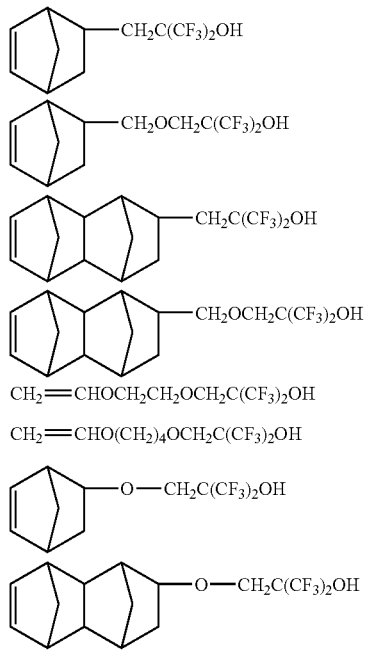

The fluorine-containing copolymer further comprises a repeat unit derived from an acrylate monomer, $CH_2$=$CRCO_2CH_2R''$, where R'' is a fluoroalkyl group of 1 to 4 carbon atoms or a hydroxyalkyl group of 1 to 4 carbon atoms, and R is H, F, an alkyl group of 1 to 5 carbon atoms, or a fluoroalkyl group of 1 to 5 carbon atoms.

When R'' is a fluoroalkyl group, it can be fully or partially fluorinated and the arrangement of carbon atoms can be straight-chain or branched (for fluoroalkyl groups of 3 or 4 carbon atoms). Suitable fluoroalkyl R'' groups include perfluoromethyl, perfluoroethyl and perfluoroisopropyl, with perfluoromethyl being preferred. Suitable hydroxyalkyl R'' groups include primary hydroxyalkyls, —$(CH_2)_m$ OH, where m=1, 2, 3 or 4.

When R is a fluoroalkyl group, it can be fully or partially fluorinated and the arrangement of carbon atoms can be straight-chain or branched (for fluoroalkyl groups of 3–5 carbon atoms). Preferably, R is H or methyl, most preferably R is H.

Two representative examples of suitable acrylates and their corresponding repeat units are given below:

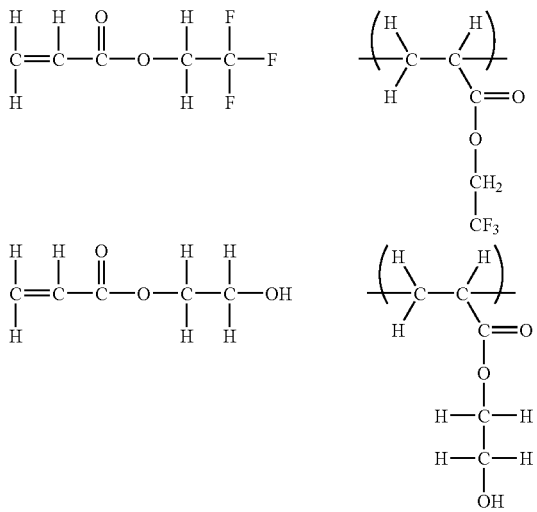

The fluorine containing copolymer can also comprise a repeat unit derived from an ethylenically unsaturated compound containing at least one fluorine atom attached to an ethylenically unsaturated carbon. This fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2$=$CFO(CF_2)_tCF$=$CF_2$, where t is 1 or 2, and $R_f''OCF$=$CF_2$ wherein $R_f''$ is a fluoroalkyl group of from 1 to 10 carbon atoms. A preferred fluoroolefin is tetrafluoroethylene.

One or more repeat units of the copolymer of this invention can be cyclic or polycyclic.

Bifunctional compounds that can initially afford crosslinking and subsequently be cleaved (e.g., upon exposure to strong acid) are also useful as comonomers in the copolymers of this invention. Photoresist compositions, incorporating copolymers comprising these bifunctional monomers, can have improved development and imaging characteristics, since exposure to light photochemically generates strong acid or base, which cleaves the bifunctional group. This results in a very significant drop in molecular weight, which can lead to greatly improved development and imaging characteristics (e.g., improved contrast).

The preferred process for polymerizing the fluorine-containing copolymers of this invention, is radical addition polymerization, which was found to avoid the problem of the hydroxy-functionalized acrylate interfering with the polymerization catalyst. Any suitable polymerization initiator, such as di-(4-tert-butylcyclohexyl)peroxy-dicarbonate, can be used under appropriate conditions. The polymerization pressure can range from about 50 to about 10,000 psig, preferably from about 200 to about 1,000 psig. The polymerization temperature can range from about 30° C. to about 120° C., preferably from about 40° C. to about 80° C. Suitable solvents include 1,1,2-trichlorofluoroethane and non-chlorofluorocarbon solvents such as 1,1,1,3,3-pentafluorobutane. The polymerization process is further enhanced by a semi-batch synthesis. In the semibatch synthesis, a part of the monomer mixture is placed in the reaction vessel and then, portionwise or continuously, the remaining monomers and initiator are added to the vessel throughout the polymerization process.

Each fluorine-containing copolymer of this invention has an absorption coefficient of less than 4.0 μm$^{-1}$ at 157 nm, preferably less than 3.5 μm$^{-1}$ at 157 nm, more preferably, less than 3.0 μm$^{-1}$ at 157 nm, and, still more preferably, less than 2.5 μm$^{-1}$ at 157 nm.

Protective Groups for Removal by PAC Catalysis

The fluorine-containing copolymers of the resist compositions of this invention can contain one or more components having protected acidic fluorinated alcohol groups (e.g., —C(R$_f$)(R$_f'$)OR$_a$, where R$_a$ is not H) or other acid groups that can yield hydrophilic groups by the reaction with acids or bases generated photolytically from photoactive compounds (PACs). A given protected fluorinated alcohol group contains a protecting group that protects the fluorinated alcohol group from exhibiting its acidity while in this protected form. A given protected acid group (R$_a$) is normally chosen on the basis of its being acid-labile, such that when acid is produced upon imagewise exposure, it will catalyze deprotection of the protected acidic fluorinated alcohol groups and production of hydrophilic acid groups that are necessary for development under aqueous conditions. In addition, the fluorine-containing copolymers may also contain acid functionality that is not protected (e.g., —C(R$_f$)(R$_f'$)OR$_a$, where R$_a$=H).

An alpha-alkoxyalkyl ether group (i.e., R$_a$=OR$_b$, R$_b$=C$_1$–C$_{11}$ alkyl) is a preferred protecting group for the fluoroalcohol group in order to maintain a high degree of transparency in the photoresist composition. An illustrative, but non-limiting, example of an alpha-alkoxyalkyl ether group that is effective as a protecting group, is methoxy methyl ether (MOM). A protected fluoroalcohol with this particular protecting group can be obtained by reaction of chloromethylmethyl ether with the fluoroalcohol. An especially preferred protected fluoroalcohol group has the structure:

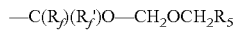

—C(R$_f$)(R$_f'$)O—CH$_2$OCH$_2$R$_5$ wherein, R$_f$ and R$_f'$ are the same or different fluoroalkyl groups of from 1 to 10 carbon atoms or taken together are (CF$_2$)$_n$ wherein n is 2 to 10; R$_5$ is H, a linear alkyl group of 1 to 10 carbon atoms, or a branched alkyl group of 3 to 10 carbon atoms.

Carbonates formed from a fluorinated alcohol and a tertiary aliphatic alcohol can also be used as protected acidic fluorinated alcohol groups.

The fluorine-containing copolymers of this invention can also contain other types of protected acidic groups that yield an acidic group upon exposure to acid. Examples of such types of protected acidic groups include, but are not limited to: A) esters capable of forming, or rearranging to, a tertiary cation; B) esters of lactones; C) acetal esters; D) β-cyclic ketone esters; E) α-cyclic ether esters; and F) esters which are easily hydrolyzable because of anchimeric assistance, such as MEEMA (methoxy ethoxy ethyl methacrylate).

Some specific examples in category A) are t-butyl ester, 2-methyl-2-adamantyl ester, and isobornyl ester.

In this invention, often, but not always, the components having protected groups are repeat units having protected acid groups that have been incorporated in the base copolymer resins of the compositions (as discussed above). Frequently the protected acid groups are present in one or more comonomers that are polymerized to form a given copolymeric base resin of this invention. Alternatively, in this invention, a copolymeric base resin can be formed by copolymerization with an acid-containing comonomer and then subsequently acid functionality in the resulting acid-containing copolymer can be partially or wholly converted by appropriate means to derivatives having protected acid groups.

Photoactive Component (PAC)

The polymers of this invention can be used to make photoresists by combining the copolymers with at least one photoactive component (PAC), a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG). Several suitable photoacid generators are disclosed in WO 00/66575.

Dissolution Inhibitors and Additives

Various dissolution inhibitors can be added to photoresists derived from the copolymers of this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions. Several suitable dissolution inhibitors are disclosed in WO 00/66575.

Positive-Working and Negative-Working Photoresists

The photoresists derived from the copolymers of this invention can either be positive- or negative-working photoresists, depending upon choice of components in the fluoropolymer, the presence or absence of optional dissolution inhibitor and crosslinking agents, and the choice of solvent used in development.

Other Components

Photoresists derived from copolymers of this invention can contain additional optional components. Examples of optional components include, but are not limited to, resolution enhancers, adhesion promoters, residue reducers, coating aids, plasticizers, and T$_g$ (glass transition temperature) modifiers.

| GLOSSARY | |
|---|---|
| Analytical/Measurements | |
| bs | broad singlet |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| $^{19}$F NMR | Fluorine-19 NMR |
| s | singlet |
| sec. | second(s) |
| m | multiplet |
| mL | milliliter(s) |
| mm | millimeter(s) |
| T$_g$ | Glass Transition Temperature |
| M$_n$ | Number-average molecular weight of a given polymer |
| M$_w$ | Weight-average molecular weight of a given polymer |
| P = M$_w$/M$_n$ | Polydispersity of a given polymer |
| Absorption coefficient | AC = A/b, where A, absorbance, = Log$_{10}$(1/T) and b = film thickness in microns, where T = transmittance as defined below. |
| Transmittance | Transmittance, T, = ratio of the radiant power transmitted by a sample to the |

-continued

GLOSSARY

| | |
|---|---|
| | radiant power incident on the sample and is measured for a specified wavelength λ (e.g., nm). |
| Chemicals/Monomers | |
| DMF | Dimethylformamide |
| HFIBO | Hexafluoroisobutylene epoxide |
| 2HEtA | 2-Hydroxyethyl acrylate |
| | Aldrich Chemical Company, Milwaukee, WI |
| NBE | Norbornene |
| | Aldrich Chemical Co., Milwaukee, WI |
| Perkadox ® 16 N | Di-(4-tert-butylcyclohexyl)peroxydicarbonate |
| | Noury Chemical Corp., Burt, NY |
| Solkane 365 mfc | 1,1,1,3,3-Pentafluorobutane |
| | Solvay Fluor, Hannover, Germany |
| t-BuAc | tert-Butyl acrylate |
| | Aldrich Chemical Company, Milwaukee, WI |
| TCB | Trichlorobenzene |
| | Aldrich Chemical Co., Milwaukee, WI |
| TFE | Tetrafluoroethylene |
| | E. I. du Pont de Nemours and Company, Wilmington, DE |
| TFEtA | 2,2,2-Trifluoroethyl acrylate |
| | Aldrich Chemical Company, Milwaukee, WI |
| THF | Tetrahydrofuran |
| | Aldrich Chemical Co., Milwaukee, WI |
| Vazo ®52 | 2,4-Dimethyl-2,2'-azobis(pentanenitrile) |
| | E. I. DuPont de Nemours & Company, Wilmington, DE |
| NB—F—OH | $X=OCH_2C(CF_3)_2OH$ |

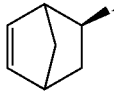

| | |
|---|---|
| Ultraviolet | |
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| UV | Ultraviolet region of the electromagnetic spectrum which ranges from 10 nanometers to 390 nanometers |
| Near UV | Region of the electromagnetic spectrum in the ultraviolet that ranges from 300 nanometers to 390 nanometers |

EXAMPLES

Unless otherwise specified, all temperatures are in degrees Celsius, all mass measurements are in grams, and all percentages are weight percentages.

Glass transition temperatures ($T_g$) were determined by DSC (differential scanning calorimetry) using a heating rate of 20° C./min, data is reported from the second heat. The DSC unit used is a Model DSC2910 made by TA Instruments, Wilmington, Del.

Assessment of 157 nm imaging sensitivity was done using a Lambda-Physik Compex 102 excimer laser configured for 157 nm operation. Vacuum ultraviolet transmission measurements were made using a McPherson spectrometer equipped with a D2 light source. Samples were spin-coated at several thicknesses on $CaF_2$ substrates, and the contribution of the substrate to the transmission was approximately removed by spectral division.

More specifically, all absorption coefficient measurements for polymers were made using the procedure listed below.

1. Samples were first spin-coated on silicon wafers on a Brewer Cee (Rolla, Mo.), Spincoater/Hotplate model 100CB.
   a) Two to four silicon wafers were spun at different speeds (e.g., 2000, 3000, 4000, 6000 rpm) to obtain differing film thickness and the coated wafers were subsequently baked at 120° C. for 30 min. The dried films were then measured for thickness on a Gaertner Scientific (Chicago, Ill.), L116A Ellipsometer (400 to 1200 angstrom range). Two spin speeds were then selected from this data to spin the $CaF_2$ substrates for the spectrometer measurement.
   b) Two $CaF_2$ substrates (1" dia.×0.80" thick) were selected and each was run as a reference data file on a McPherson Spectrometer (Chemsford, Mass.), 234/302 monochrometer, using a 632 Deuterium Source, 658 photomultiplier, and Keithley 485 picoammeter.
   c) Two speeds were selected from the silicon wafer data a) to spin the sample material onto the $CaF_2$ reference substrates (e.g., 2000 and 4000 rpm) to achieve the desired film thickness. Then each was baked at 120° C. for 30 min. and the sample spectra was collected on the McPherson Spectrometer; the sample files were then divided by the reference $CaF_2$ files.
   d) The resulting absorbance files were then adjusted (sample film on $CaF_2$ divided by $CaF_2$ blank) for film thickness to give absorbance per micron (abs/mic), which was done using GRAMS386 and KALEIDAGRAPH software.

Example 1

Synthesis of NB—F—OH

A dry round bottom flask equipped with mechanical stirrer, addition funnel and nitrogen inlet was swept with nitrogen and charged with 19.7 g (0.78 mol) of 95% sodium hydride and 500 mL of anhydrous DMF. The stirred mixture was cooled to 5° C. and 80.1 g (0.728 mol) of exo-5-norbornen-2-ol was added dropwise so that the temperature remained below 15° C. The resulting mixture was stirred for 0.5 hr. HFIBO (131 g, 0.728 mol) was added dropwise at room temperature. The resulting mixture was stirred overnight at room temperature. Methanol (40 mL) was added and most of the DMF was removed on a rotary evaporator under reduced pressure. The residue was treated with 200 mL water, and glacial acetic acid was added until the pH was about 8.0. The aqueous mixture was extracted with 3×150 mL ether. The combined ether extracts were washed with 3×150 mL water and 150 mL brine, dried over anhydrous sodium sulfate, and concentrated on a rotary evaporator to an oil. Kugelrohr distillation at 0.15–0.20 torr and a pot temperature of 30–60° C. gave 190.1 (90%) of product. $^1H$ NMR (δ, $CD_2Cl_2$) 1.10–1.30 (m, 1H), 1.50 (d, 1H), 1.55–1.65 (m, 1H), 1.70 (s, 1H), 1.75 (d, 1H), 2.70 (s, 1H), 2.85 (s, 1H), 3.90 (d, 1H), 5.95 (s, 1H), 6.25 (s, 1H). Another sample prepared in the same fashion was submitted for elemental analysis. Calcd. for $C_{11}H_{12}F_6O_2$: C, 45.53; H, 4.17; F, 39.28. Found: C, 44.98; H, 4.22; F, 38.25.

Example 2

Polymer of TFE, NB—F—OH, t-BuAc and 2HEtA

A metal pressure vessel of approximate 270 mL capacity was charged with 70.33 g NB—F—OH, 0.64 g tert-butyl acrylate, 0.29 g 2HEtA and 25 mL Solkane 365. The vessel was closed, cooled to about −15° C. and pressured to 400 psig with nitrogen and vented several times. The reactor contents were heated to 50° C. TFE was added to a pressure of 340 psig and a pressure regulator was set to maintain the pressure at 340 psig throughout the polymerization by adding TFE as required. A solution of 80.56 g of NB—F—OH, 6.22 g of tert-butyl acrylate and 2.42 g 2HEtA diluted to 100 mL with Solkane 365 mfc was pumped into the reactor at a rate of 0.10 mL/minute for 12 hr. Simultaneously with the monomer feed solution, a solution of 6.3 g Perkadox®16N and 45 mL methyl acetate diluted to 75 mL with Solkane 365 mfc was pumped into the reactor at a rate of 2.0 mL/minute for 6 minutes, and then at a rate of 0.08 mL/minute for 8 hours. After 16 hours reaction time, the vessel was cooled to room temperature and vented to 1 atmosphere. The recovered polymer solution was added slowly to an excess of hexane while stirring. The precipitate was filtered, washed with hexane and air-dried. The resulting solid was dissolved in a mixture of THF and Solkane 365 mfc and added slowly to excess hexane. The precipitate was filtered, washed with hexane and dried in a vacuum oven overnight to give 56.1 g of white polymer. From its $^{13}$C NMR spectrum, the polymer composition was found to be 35% TFE, 42% NB—F—OH, 18% t-BuAc and 5% 2HEtA. DSC: Tg=134° C. GPC: Mn=5400; Mw=9100; Mw/Mn=1.67. Anal. Found: C, 44.74; H; 4.17; F; 38.79.

Example 3

Polymer of TFE, NB—F—OH, t-BuAc and 2HEtA

The procedure of Example 2 was followed except 70.33 g NB—F—OH, 0.85 g tert-butyl acrylate, 0.096 g 2HEtA and 25 mL Solkane 365 were initially placed in the vessel. A solution of 78.55 g of NB—F—OH, 8.71 g of tert-butyl acrylate, and 0.97 g 2HEtA diluted to 100 mL with Solkane 365 mfc was pumped into the reactor during the polymerization at a rate of 0.10 mL/minute for 12 hr. Simultaneously with the monomer feed solution, a solution of 7.3 g Perkadox®16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours reaction time, the vessel was cooled to room temperature and vented to 1 atmosphere. The recovered polymer solution was added slowly to an excess of heptane while stirring. The precipitate was filtered, washed with heptane and air-dried. The resulting solid was dissolved in a mixture of THF and Solkane 365 mfc and added slowly to excess heptane. The precipitate was filtered, washed with heptane and dried in a vacuum oven overnight to give 46.4 g of white polymer. From its $^{13}$C NMR spectrum, the polymer composition was found to be 33% TFE, 46% NB—F—OH, 16% t-BuAc and 5% 2HEtA. DSC: Tg=145° C. GPC: Mn=5300; Mw=8400; Mw/Mn 1.57. Anal. Found: C, 45.51; H, 4.35; F, 37.28.

Example 4

Polymer of TFE, NB—F—OH, t-BuAc and 2HEtA

The procedure of Example 2 was followed except 68.15 g NB—F—OH, 1.76 g tert-butyl acrylate, 0.145 g 2HEtA and 25 mL Solkane 365 were initially placed in the vessel. A solution of 70.49 g of NB—F—OH, 12.13 g of tert-butyl acrylate and 1.09 g 2HEtA diluted to 100 mL with Solkane 365 mfc was pumped into the reactor during the polymerization at a rate of 0.10 mL/minute for 12 hr. Simultaneously with the monomer feed solution, a solution of 7.3 g Perkadox®16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours reaction time, the vessel was cooled to room temperature and vented to 1 atmosphere. The recovered polymer solution was added slowly to an excess of heptane while stirring. The precipitate was filtered, washed with heptane and air-dried. The resulting solid was dissolved in a mixture of THF and Solkane 365 mfc and added slowly to excess heptane. The precipitate was filtered, washed with heptane and dried in a vacuum oven overnight to give 49 g of white polymer. From its $^{13}$C NMR spectrum, the polymer composition was found to be 28% TFE, 35% NB—F—OH, 30% t-BuAc and 6% 2HEtA. DSC: Tg=150° C. GPC: Mn=6000; Mw=11000; Mw/Mn=1.82. Anal. Found: C, 46.42; H, 4.28; F, 36.13.

Example 5

Polymer of TFE, NB—F—OH, t-BuAc and 2HEtA

A metal pressure vessel of approximate 1 L capacity was charged with 206.63 g NB—F—OH, 3.84 g tert-butyl acrylate, 0.87 g 2HEtA and 75 mL Solkane 365. The vessel was closed, cooled to about −15° C. and pressured to 400 psig with nitrogen and vented several times. The reactor contents were heated to 50° C. TFE was added to a pressure of 320 psig and a pressure regulator was set to maintain the pressure at 320 psig throughout the polymerization by adding TFE as required. A solution of 202.28 g of NB—F—OH, 23.81 g of tert-butyl acrylate and 5.39 g 2HEtA diluted to 250 mL with Solkane 365 mfc was pumped into the reactor at a rate of 0.28 mL/minute for 12 hr. Simultaneously with the monomer feed solution, a solution of 18.45 g Perkadox®16N and 100 mL methyl acetate diluted to 200 mL with Solkane 365 mfc was pumped into the reactor at a rate of 6.0 mL/minute for 6 minutes, and then at a rate of 0.24 mL/minute for 8 hours. After 16 hours reaction time, the vessel was cooled to room temperature and vented to 1 atmosphere. The recovered polymer solution was added slowly to an excess of heptane while stirring. The precipitate was filtered, washed with heptane and air-dried. The resulting solid was dissolved in a mixture of THF and Solkane 365 mfc and added slowly to excess heptane. The precipitate was filtered, washed with heptane and dried in a vacuum oven overnight to give 156.2 g of white polymer. From its $^{13}$C NMR spectrum, the polymer composition was found to be 31% TFE, 44% NB—F—OH, 21% t-BuAc and 3% 2HEtA. DSC: Tg=139° C. GPC: Mn=4200; Mw=8000; Mw/Mn=1.87. Anal. Found: C, 45.92; H, 4.23; F, 36.83.

Example 6

Polymer of TFE, NB—F—OH, t-BuAc and TFEtA

The procedure of Example 2 was followed except 70.33 g NB—F—OH, 0.64 g tert-butyl acrylate, 0.39 g TFEtA and 25 mL Solkane 365 was initially placed in the vessel. A solution of 80.56 g of NB—F—OH, 6.22 g of tert-butyl acrylate and 3.21 g TFEtA diluted to 100 mL with Solkane 365 mfc was pumped into the reactor during the polymerization at a rate of 0.10 mL/minute for 12 hr. Simultaneously with the monomer feed solution, a solution of 6.3 g Perkadox®16N and 45 mL methyl acetate diluted to 75 mL with Solkane 365 mfc was pumped into the reactor at a rate of 2.0 mL/minute for 6 minutes, and then at a rate of 0.08 mL/minute for 8 hours. After 16 hours reaction time, the vessel was cooled to room temperature and vented to 1 atmosphere. The recovered polymer solution was added slowly to an excess of hexane while stirring. The precipitate was filtered, washed with hexane and air-dried. The resulting solid was dissolved in a mixture of THF and Solkane 365 mfc and added slowly to excess hexane. The precipitate was filtered, washed with hexane and dried in a vacuum oven overnight to give 52.34 g of white polymer. From its $^{13}$C NMR spectrum, the polymer composition was found to be 36% TFE, 41% NB—F—OH, 19% t-BuAc and 4% TFEtA. DSC: Tg=136° C. GPC: Mn=5800; Mw=9300; Mw/Mn=1.59. Anal. Found: C, 44.39; H, 3.94; F, 39.96.

Example 7

Polymer of TFE, NB—F—OH, t-BuAc and TFEtA

A metal pressure vessel of approximate 270 mL capacity was charged with 70.33 g NB—F—OH, 0.85 g tert-butyl acrylate, 0.13 g TFEtA and 25 mL Solkane 365. The vessel was closed, cooled to about −15° C. and pressured to 400 psig with nitrogen and vented several times. The reactor contents were heated to 50° C. TFE was added to a pressure of 340 psig and a pressure regulator was set to maintain the pressure at 340 psig throughout the polymerization by adding TFE as required. A solution of 78.54 g of NB—F—OH, 8.71 g of tert-butyl acrylate and 1.28 g TFEtA diluted to 100 mL with Solkane 365 mfc was pumped into the reactor at a rate of 0.10 mL/minute for 12 hr. Simultaneously with the monomer feed solution, a solution of 7.3 g Perkadox®16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours reaction time, the vessel was cooled to room temperature and vented to 1 atmosphere. The recovered polymer solution was added slowly to an excess of hexane while stirring. The precipitate was filtered, washed with hexane and air-dried. The resulting solid was dissolved in a mixture of THF and Solkane 365 mfc and added slowly to excess to hexane. The precipitate was filtered, washed with hexane and dried in a vacuum oven overnight to give 55.4 g of white polymer. From its $^{13}$C NMR spectrum, the polymer composition was found to be 33% TFE, 44% NB—F—OH, 19% t-BuAc and 3% TFEtA. DSC: Tg=138° C. GPC: Mn=5300; Mw=8400; Mw/Mn=1.59. Anal. Found: C, 44.98; H, 4.21; F, 38.80.

Example 8

Polymer of TFE, NB—F—OH, t-BuAc and TFEtA

The procedure of Example 7 was followed except 68.88 g NB—F—OH, 1.15 g tert-butyl acrylate, 0.55 g TFEtA and 25 mL Solkane 365 were initially placed in the vessel. TFE was added to a pressure of 320 psig and a pressure regulator was set to maintain the pressure at 320 psig throughout the polymerization by adding TFE as required. A solution of 75.52 g of NB—F—OH, 8.00 g of tert-butyl acrylate and 3.74 g TFEtA diluted to 100 mL with Solkane 365 mfc was pumped into the reactor during the polymerization at a rate of 0.10 mL/minute for 12 hr. Simultaneously with the monomer feed solution, a solution of 7.3 g Perkadox®16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours reaction time, the vessel was cooled to room temperature and vented to 1 atmosphere. The recovered polymer solution was added slowly to an excess of hexane while stirring. The precipitate was filtered, washed with hexane and air-dried. The resulting solid was dissolved in a mixture of THF and Solkane 365 mfc and added slowly to excess hexane. The precipitate was filtered, washed with hexane and dried in a vacuum oven overnight to give 51.3 g of white polymer. From its $^{13}$C NMR spectrum, the polymer composition was found to be 31% TFE, 41% NB—F—OH, 20% t-BuAc and 7% TFEtA. DSC: Tg=140° C. GPC: Mn=4300; Mw=8500; Mw/Mn=1.98. Anal. Found: C, 45.11; H, 4.05; F, 38.30.

Example 9

Imaging of Polymer of TFE, NB—F—OH, t-BuAc, and 2HEtA

The following solution was prepared, magnetically stirred overnight, and filtered through a 0.45 μm PTFE syringe filter before use:

| Component | Wt. (gm) |
| --- | --- |
| TFE/NB—F—OH/t-BuAc/2HEtA Polymer from Example 5 | 1.507 |
| 2-Heptanone | 10.715 |
| 6.82% (wt) solution of triphenylsulfonium nonaflate dissolved in cyclohexanone which had been filtered through a 0.45 μm PTFE syringe filter. | 0.778 |

This resist formulation was spin cast on an 8 inch Si wafer at a speed of 1992 rpm, yielding a film of measured thickness 2125 Å after PAB at 150° C. for 60 sec. This film was then exposed to 157 nm radiation in the Exitech stepper using a phase shift mask to yield a latent image. After exposure, the film was post-exposure baked at 105° C. for 60 sec, and then puddle developed at 60 sec at room temperature using the tetramethyl ammonium hydroxide developer. The resulting image was examined using a JEOL 7550 SEM. At an exposure dose of 13 mJ/cm$^2$, the image was found to exhibit features at 80 nm resolution.

What is claimed is:

1. A fluorine-containing copolymer comprising:
   a. a first repeat unit derived from an ethylenically unsaturated compound containing a functional group having the structure:

—X$_r$(CH$_2$)$_q$C(R$_f$)(R$_f'$)OR$_a$ wherein
   R$_f$ and R$_f'$ are the same or different fluoroalkyl groups of from 1 to 10 carbon atoms, or taken together are (CF$_2$)$_n$;
   n is an integer from 2 to 10;
   X is selected from the group consisting of S, O, N, and P;
   q=0 and r=0, or q=1 and r=0 or 1; and
   R$_a$ is H or an acid- or base-labile protecting group; and
   b. a second repeat unit derived from CH$_2$=CRCO$_2$CH$_2$R″,
   wherein
   R″ is a fluoroalkyl group of 1 to 4 carbon atoms or a hydroxyalkyl group of 1 to 4 carbon atoms; and
   R is H, F, an alkyl group of 1 to 5 carbon atoms, or a fluoroalkyl group of 1 to 5 carbon atoms.

2. The fluorine-containing copolymer of claim 1, further comprising a third repeat unit derived from an ethylenically unsaturated compound having at least one fluorine atom covalently attached to an ethylenically unsaturated carbon atom.

3. The fluorine-containing copolymer of claim 2, wherein the third repeat unit is derived from an ethylenically unsaturated compound selected from the group consisting of tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a fluoroalkyl group of from 1 to 10 carbon atoms.

4. The fluorine-containing copolymer of claim 3, wherein the third repeat unit is derived from tetrafluoroethylene.

5. The fluorine-containing copolymer of claim 1, wherein R" is $-CF_3$ or $-CH_2OH$.

6. The fluorine-containing copolymer of claim 1, wherein $R_a$ is H and the fluorine-containing copolymer further comprises a repeat unit derived from an ethylenically unsaturated compound containing a functional group having the structure

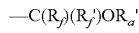
$-C(R_f)(R_f')OR_a'$ wherein $R_f$ and $R_f'$ are the same or different fluoroalkyl groups of from 1 to 10 carbon atoms or taken together are $(CF_2)_n$ wherein n is 2 to 10 and $R_a'$ is an acid- or base-labile protecting group.

7. The fluorine-containing copolymer of claim 6, wherein $R_a'$ is $-CH_2OCH_2R_5$, and $R_5$ is H, a linear alkyl group of 1 to 10 carbon atoms, or a branched alkyl group of 3 to 10 carbon atoms.

8. The fluorine-containing copolymer of claim 1, wherein the first repeat unit is derived from a cyclic or polycyclic ethylenically unsaturated compound.

9. The fluorine-containing copolymer of claim 8, wherein the first repeat unit is derived from a fluorinated alcohol-substituted norbornene.

10. The fluorine-containing copolymer of claim 9, wherein the fluorinated alcohol substituent is a hexafluoroisopropanol group.

11. The fluorine-containing copolymer of claim 10, wherein R" is $-CF_3$ or $-CH_2OH$.

12. The fluorine-containing copolymer of claim 1 further comprising a repeat unit derived from t-butyl acrylate.

13. The fluorine-containing copolymer of claim 1 made by a semi-batch synthesis.

14. The fluorine-containing copolymer of claim 1, wherein r=1 and q=1.

15. The fluorine-containing copolymer of claim 1, wherein the first repeat unit is derived from an ethylenically unsaturated compound selected from the group consisting of:

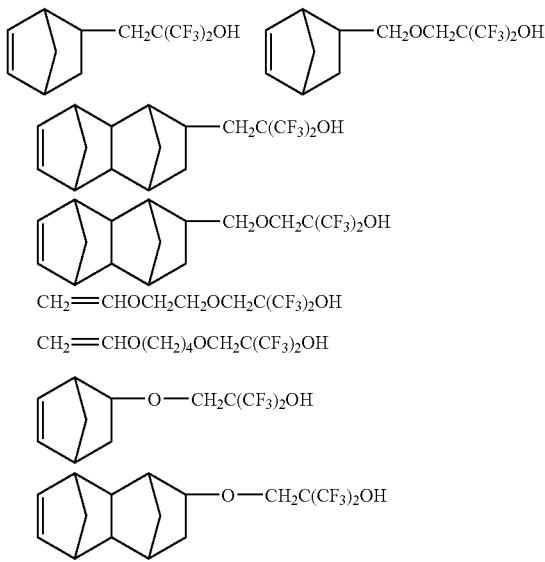

16. The fluorine-containing copolymer of claim 1, wherein said copolymer has an absorption coefficient of less than 3.5 $\mu m^{-1}$ at 157 nm.

* * * * *